United States Patent
You et al.

(10) Patent No.: US 12,419,094 B2
(45) Date of Patent: Sep. 16, 2025

(54) SEMICONDUCTOR DEVICE WITH TRIMMED CHANNEL REGION AND METHOD OF MAKING THE SAME

(71) Applicant: TAIWAN SEMICONDUCTOR MANUFACTURING COMPANY, LTD., Hsinchu (TW)

(72) Inventors: Jia-Chuan You, Hsinchu (TW); Kuan-Ting Pan, Hsinchu (TW); Shi Ning Ju, Hsinchu (TW); Kuo-Cheng Chiang, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 951 days.

(21) Appl. No.: 17/395,071

(22) Filed: Aug. 5, 2021

(65) Prior Publication Data

US 2023/0045491 A1    Feb. 9, 2023

(51) Int. Cl.
| | | |
|---|---|---|
| *H10D 30/62* | (2025.01) | |
| *H10D 30/67* | (2025.01) | |
| *H10D 64/01* | (2025.01) | |
| *H10D 64/23* | (2025.01) | |
| *H10D 84/01* | (2025.01) | |
| *H10D 84/03* | (2025.01) | |
| *H10D 84/83* | (2025.01) | |

(52) U.S. Cl.
CPC ....... *H10D 64/258* (2025.01); *H10D 30/6735* (2025.01); *H10D 30/6757* (2025.01); *H10D 64/017* (2025.01); *H10D 84/0151* (2025.01); *H10D 84/038* (2025.01); *H10D 84/83* (2025.01)

(58) Field of Classification Search
None
See application file for complete search history.

(56) References Cited

U.S. PATENT DOCUMENTS

| | | | |
|---|---|---|---|
| 2016/0155739 A1* | 6/2016 | Ting | H01L 29/6656 438/283 |
| 2020/0020782 A1* | 1/2020 | Ching | H01L 21/76224 |

* cited by examiner

*Primary Examiner* — Steven B Gauthier
*Assistant Examiner* — Lamont B Koo
(74) *Attorney, Agent, or Firm* — Hauptman Ham, LLP

(57) ABSTRACT

A semiconductor device includes an active area extending in a first direction over a substrate, the active area including at least one conductive path extending from a source region, through a channel region, to a drain region; and a gate dielectric on a surface of the at least one conductive path in the channel region. The semiconductor device also includes an isolating fin at a first side of the active area, the isolating fin having a first fin region having a first fin width adjacent to the source region, a second fin region having a second fin width adjacent to the channel region, and a third fin region having the first fin width adjacent to the drain region; and a gate electrode against the gate dielectric in the channel region.

20 Claims, 11 Drawing Sheets

SEMICONDUCTOR DEVICE WITH TRIMMED CHANNEL REGION AND METHOD OF MAKING THE SAME

BACKGROUND

As semiconductor device dimensions shrink, deviations in manufacturing processes result in an increased likelihood of manufacturing errors which result in short circuits or open circuits in semiconductor devices. Manufacturing process deviations include unexpected pattern shifts, uneven deposition thickness of materials, and/or residues left on a semiconductor device after etching. Shifted patterns increase a risk of misalignment of features in a semiconductor device, making the likelihood of dielectric breakdown or accidental short circuits greater. Uneven deposition results in this spots of material where an etch process is able to accidentally expose a feature of a device which is normally insulated. Etch residues increase a risk of short circuits as conductive, or semiconducting, materials form bridges under insulating material configured to electrically isolate elements of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
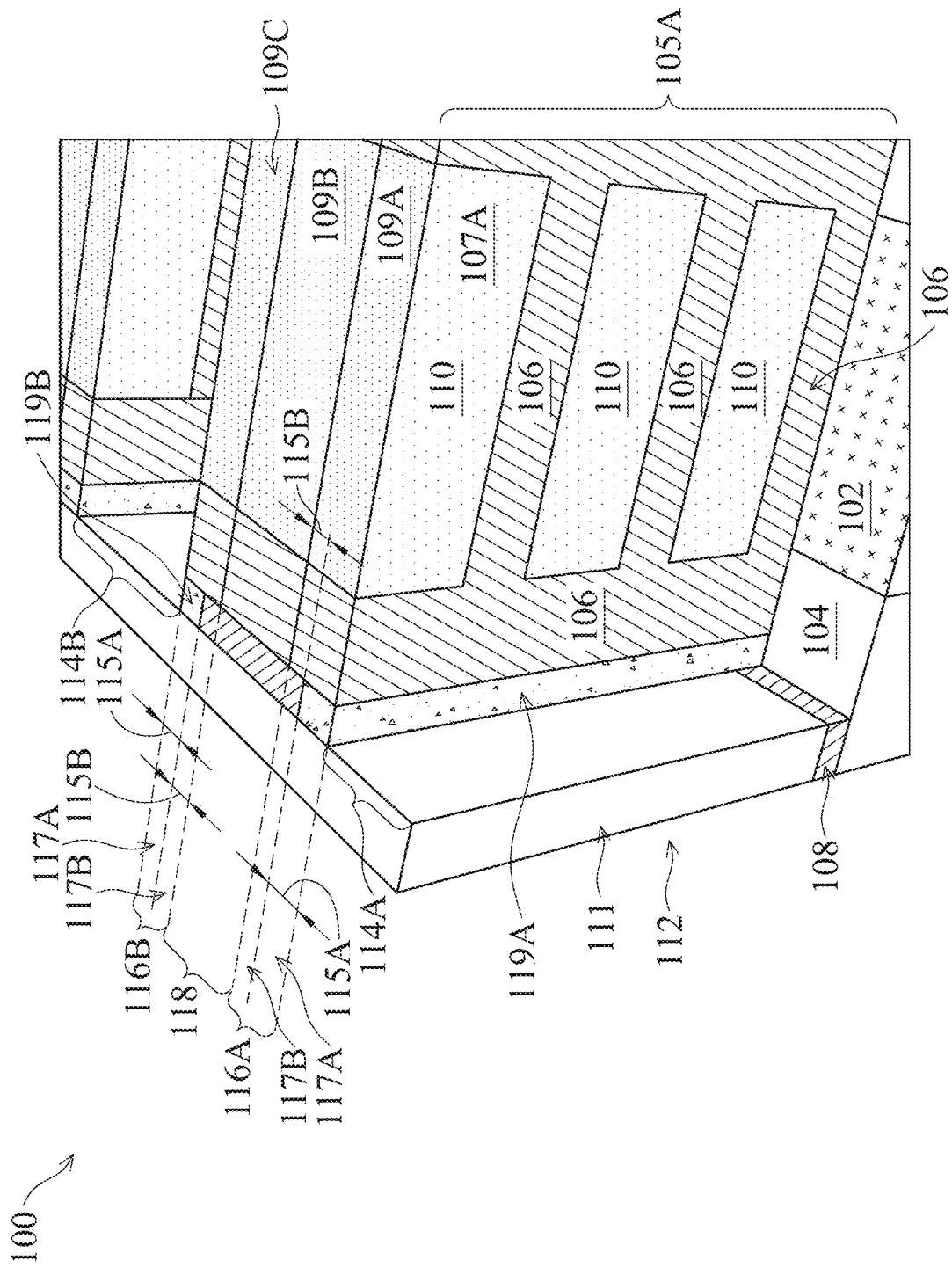
FIG. 1A is a perspective view of a semiconductor device during a manufacturing process, in accordance with some embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As dimensions of circuit elements in semiconductor devices shrink, the likelihood of a deviation a manufacturing process resulting in a short circuit in the semiconductor device increases. Short circuits are reduced by improving the quality of dielectric material between conductive elements in the semiconductor device. Short circuits are also reduced by adjusting manufacturing process to reduce the presence of stringers between conductive elements of the semiconductor device. A stringer is a filament of conductive material which extends between conductive elements and provides a path for electrical current to flow between the conductive elements. Stringers are residual conductive material not removed during, e.g., an etch and/or clean process, and potentially cause or contribute to short circuits in a semiconductor device. Further, as dimensions of circuit elements in semiconductor devices shrink, depositing material for gate electrodes becomes increasingly difficult, especially for gate-all-around (GAA) semiconductor devices.

In some semiconductor devices, the active area of a transistor short circuits to the gate electrode of the transistor as dielectric material between a source region or a drain region (SD region) is eroded by etching processes. Erosion of the dielectric material allows gate electrode material to make direct contact with an SD region of the active area. In the present disclosure, frequency of short circuits between gate electrodes and SD regions of an active area is reduced by the formation of an active area spacer which extends along a sidewall of the active area and a fin bordering on the active area. In some embodiments, an active area spacer includes a material which is more resistant to etch processing than the materials being etched in the channel region of the active area during the formation of a gate electrode in a semiconductor. An active area spacer is manufactured, in some embodiments, by etching a portion of a sacrificial dielectric layer of an insulating fin extending along the sidewall of the active area, and depositing a spacer material into the formed recess. In some embodiments, the active area spacer and the sacrificial dielectric material are both along the sidewall of the active area between an SD region and the channel region of a transistor. In some embodiments, the active area spacer remains along the sidewall between the SD region and the channel region, and the sacrificial dielectric material has been completely removed, after the gate electrode has been manufactured over the channel region (e.g., the active area spacer material separates the SD region from the original insulating fin material along a full length of the SD region of the transistor.

In some semiconductor devices, voids are formed in gate electrode material (semiconductor material, or a pure metal, or a metal alloy) deposited for gate electrode structures. Voids are a type of uneven fill pattern which results from, e.g., material being deposited at a slower rate in a lower portion of the volume being filled, and at a faster rate at an upper portion of the volume being filled. During some types of uneven fill, the material being deposited on sidewalls of the volume being filled closes the top portion of the opening, blocking further deposition on the lower sidewalls of the volume being filled, forming a void. Voids result in elevated resistance of the gate electrode, deviation of transistor switching speeds from a design, and shortened device lifetime. Electromigration of gate electrode material results in breaks or "opens" in the semiconductor device, and transistor failure, in some instances.

In GAA semiconductor devices, the gate electrode is a portion of gate electrode material (e.g., a pure metal such as tungsten, and so forth) which is deposited into an opening and against a gate dielectric material. The gate dielectric material electrically isolates the gate electrode material from the channel region of an active area. In GAA semiconductor devices, the deposited gate electrode material is deposited against the gate dielectric material in the opening by, e.g., sputtering. In some embodiments, gate electrode material is sputtered onto a heated substrate to promote movement of the gate electrode material into portions of the volume being filled which are masked from the sputtering source by a conductive path/channel portion of the GAA semiconductor device.

FIG. 1A is a perspective view of a semiconductor device 100 during a manufacturing process, in accordance with some embodiments of the present disclosure. In FIG. 1A, semiconductor device 100 includes a pillar 102 of substrate material extending upward from a substrate (not shown, but see substrate 302 in FIG. 3A, below). An isolation structure 104 (e.g., a shallow isolation structure, or STI) is formed over the substrate and along a sidewall of the pillar 102. An active area 105A includes alternating layers of a first semiconductor material 106 and a second semiconductor material 110. The second semiconductor material 110 comprises at least one conductive path 107A which includes a source portion 109A, a channel portion 109B, and a drain portion 109C. The at least one conductive path 107A of the active area 105A extends in a substantially parallel manner over the pillar 102 of substrate material. End portions (e.g., the source portion 109A and the drain portion 109C) of the at least one conductive path 107A are embedded in the first semiconductor material 106. In active area 105A, a source contact region 114A is portion of the semiconductor device extending from an isolating fin at a first side of an active area, to a second isolating fin at a second side of the active area, where a source contact (not shown) extends along an end of the conductive paths 107A and electrically connects to the source portion 109A of the at least one conductive path 107A. After a source contact (not shown) is deposited in source contact region 114A at the source end of the at least one conductive paths 107A, the source contact (not shown), the dielectric fill 111, the sacrificial dielectric material 108, and the first semiconductor material 106 extend around the sides of the active area spacer 119A along the side of the active area 105A. Drain contact region 114B is a portion of the semiconductor device extending from an isolating fin at a first side of an active area, to a second isolating fin at a second side of the active area, where a drain contact (not shown) extends along an end of the conductive paths 107A and electrically connects to the drain portion 109C of the at least one conductive path 107A. After the drain contact (not shown) is deposited at the drain end of the at least one conductive paths 107A, the drain contact, the dielectric fill 111, the sacrificial dielectric material 108, and the first semiconductor material 106 extend around the sides of the active area spacer 119B along the side of the active area 105A. A channel region 118 is between the source contact region 114A and the drain contact region 114B, and is where the gate electrode (not shown) surrounds the channel portion 109B of the at least one conductive path 107A. Channel region 118 extends from the isolating fin 112 at a first side of the active area 105A to a second isolation fin at an opposite side of the active area 105A. Trim zone 116A is between the channel region 118 and the source contact region 114A. Trim zone 116B is between the channel region 118 and the drain contact region 114B.

A sidewall of an isolating fin 112 is adjacent to and extends in parallel to a sidewall of the active area 105A, and in parallel to the at least one conductive path 107A therein. Isolating fin 112 includes a sacrificial dielectric material 108 and a dielectric fill material 111. Isolating fin 112 electrically isolates active areas at opposite sides of the isolating fin from each other. A sacrificial dielectric material 108 is at an outer portion of the isolating fin, and is configured to partially removed to allow for [1] increased space between the isolating fin 112 and a channel portion 109B of the at least one conductive path 107A in the active area 105A (to reduce likelihood of void formation during deposition of gate electrode material), and [2] deposition of the active area spacer (see active area spacers 119A, 119B, described further, below), which provide additional protection from punchthrough between the gate electrode material deposited in channel region 118, and the source contact (not shown) deposited in source region 114A, or the drain contact (not shown) deposited in the drain region 114B of the semiconductor device 100. In a semiconductor device manufacturing process, punchthrough occurs when an etch process unexpectedly penetrates through a dielectric material. Deposition of conductive material onto a semiconductor device which has undergone punchthrough results in a short circuit to the conductive material deposited into the opening formed by the punchthrough of the dielectric material.

Semiconductor device 100 includes a first trim zone 116A and a second trim zone 116B of the isolating fin 112. First trim zone 116A is between channel region 118 and source contact region 114A, and between dielectric fill 111 and first semiconductor material 106. Second trim zone 116B is between channel region 118 and drain contact region 114B, and between dielectric fill 111 and first semiconductor material 106. Channel trim zone 118A is between first trim zone 116A and second trim zone 116B, and corresponds to a portion of the sacrificial dielectric material 108 which is removed (trimmed) prior to gate electrode material deposition in channel region 118.

First trim zone 116A and second trim zone 116B are each sub-divided into a gate side trim region 117B closest to the channel trim zone 118A, and a SD side trim region 117A farthest from the channel trim zone 118A. In semiconductor device 100, the SD side trim regions 117A in the first trim zone 116A is filled with active area spacer 119A, and the second trim zone 116B is filled with active area spacer 119B. In first trim zone 116A and second trim zone 116B, SD side trim regions 117A are larger than gate side trim regions 117B. In some embodiments, the SD side trim regions are smaller than the entirety of the first trim zone or the second trim zone to avoid having the active area spacer protrude into the channel region. Gate side trim zone 117B provides a buffer between the active area spacer (see active area spacers 119A and 119B) and the channel trim zone to reduce the likelihood of the active area spacer contributing to voids in the gate electrode material fill process.

In some embodiments, the first trim zone and the second trim zone have a length smaller than the channel length (e.g., the dimension of channel region 118, or channel portion 109B, between source portion 109A and drain portion 109C)

of the semiconductor device. In some embodiments, the first trim zone and the second trim zone are between 5 nm and 10 nm.

Figure 1B:
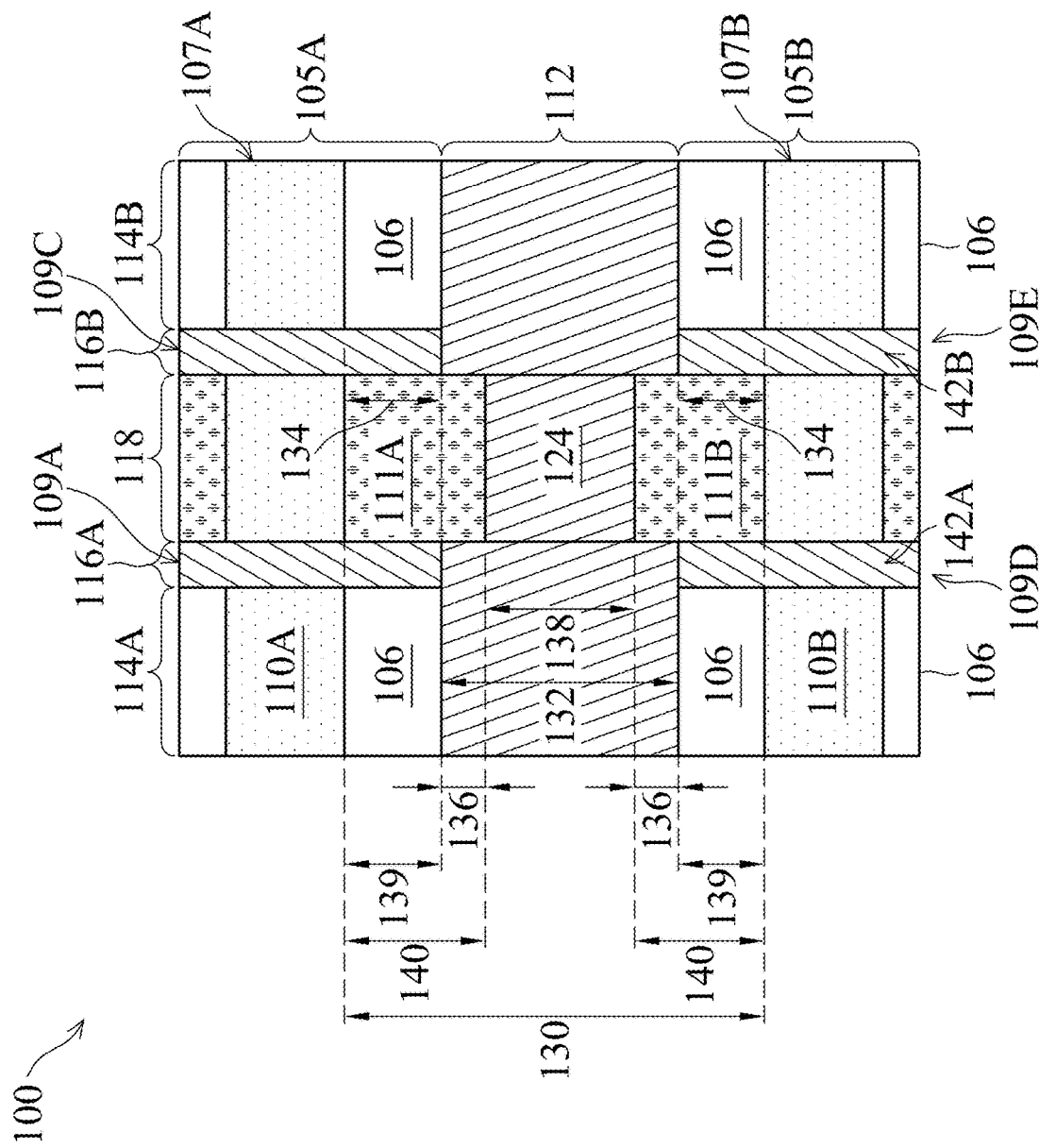
FIG. 1B is a top view of a semiconductor device, in accordance with some embodiments.

FIG. 1B is a top view of semiconductor device 100, in accordance with some embodiments. Elements of semiconductor device 100 which have a same structure and function in FIG. 1A and in FIG. 1B have a same identifying numeral for clarity. A person of ordinary skill will understand that the embodiments described herein are non-limiting representations of the subject matter of the present disclosure, and that other embodiments are also within the scope of the present disclosure. In FIG. 1B, an active area 105A includes portions of first semiconductor material 106 on either side of the at least one conductive path 107A. Active area 105B includes portions of first semiconductor material 106 on either side of the at least one conductive path 107B. Isolating fin 112 is between active area 105A and active area 105B. A trimmed isolating fin region 124 of isolating fin 112 is located between active area 105A and active area 105B. A gate dielectric material (not shown) is over the at least one conductive path 107A in the channel region 118 of active area 105A. A gate dielectric material (not shown) is over the at least one conductive path 107B in the channel region 118 of active area 105B.

First channel separation distance 130 is a distance between conductive path 107A of active area 105A and the conductive path 107B of active area 105B. In some embodiments, the first channel separation distance is not less than 15 nanometers (nm) and not more than 30 nanometers, although other channel separation distances are also envisioned within the scope of the present disclosure. Channel separation distances of less than 15 nm are difficult to reproduce on a semiconductor substrate because of difficulty with pattern transfer during, e.g., ultraviolet lithography, and difficulty with etching features with straight edges.

Second channel separation distance 140 is the separation distance between the at least one conductive path 107A and the trimmed isolating fin region 124, and the separation distance between the at least one conductive path 107B and the trimmed isolating fin region 124. In some embodiments, the second channel separation distance ranges from 6 nm to about 24 nm. Second channel separation distances smaller than about 6 nm result in semiconductor devices with voids in the gate electrodes. Separation distances larger than 24 nm are sufficiently large that the gate electrode material filled into the space between the trimmed isolating fin region and the channel portion of a conductive path is not likely to have voids during gate electrode material deposition.

Isolating fin width 132 is the width of the isolating fin 112 without any trimming. Isolating fin width 132 includes the width of the dielectric fill 111 at the center of the isolating fin 112, and the thickness of the sacrificial dielectric material 108 (see, e.g., the separation distance 136) at the outer sides of the isolating fin 112. In some embodiments, isolating fin width 132 ranges from 12 nm to 30 nm. For isolating fin widths smaller than 12 nm, there is insufficient material to provide both the sacrificial dielectric material at the outer sides of the isolating fin and the dielectric fill at the interior of the isolating to insulate the transistor contacts, or the gate electrodes, form each other without increased risk of short circuits across the isolating fin, or to avoid parasitic capacitance between contacts/gate electrodes of adjacent transistors.

Isolating fin width 138 is a width of the trimmed isolating fin region 124, after isolating fin 112 in the channel region 118 has been trimmed. In some embodiments, isolating fin width 138 ranges from 6 nm to 20 nm. For isolating fin widths of smaller than 6 nm, semiconductor devices have an elevated risk of "bridging" short circuits, which extend between gate electrodes of adjacent transistors after chemical mechanical polishing (CMP, or planarization) of the semiconductor device leaves a conductive path between the adjacent gate electrodes. For isolating fin widths of greater than 20 nm, the proportion of the semiconductor device area which is used by isolating fins reduces the transistor density of the of the semiconductor device.

Separation distance 136 is a separation distance between the isolating fin 112 and at least one conductive path 107A of active area 105A, and a separation distance between the isolating fin 112 and at least one conductive path 107B of active area 105B. In some embodiments, the separation distance 136 is equivalent to the thickness of the sacrificial dielectric material deposited at the sides of the active area fins as part of operations to manufacture isolating fins. In some embodiments, the separation distance 136 is not less than 3 nm and not more than 10 nm. For separation distance 136 of less than 3 nm, the deposition of the active area spacer material is prone to uneven coverage and increased likelihood of a short circuit from unexpected punchthrough in a semiconductor device. For separation distance of greater than 10 nm, the width of the isolating fins of a semiconductor device interfere with achieving transistor density specifications in a semiconductor device.

Separation distance 139 is a distance between the sides of the conductive path through an active area (see conductive path 107A in active area 105A), and the side of the sacrificial dielectric material. Separation distance 139 corresponds to the thickness of the first semiconductor material in the active area (e.g., the semiconductor cap layer material), and is determined by the pattern applied to the semiconductor device during manufacturing steps for forming the active area fins and manufacturing the isolation structures adjacent to the substrate pillars.

In FIG. 1B, gate electrode 111A is in channel region 118 over the at least one conductive path 107A of active area 105A. Gate electrode 111B is in channel region 118 over the at least one conductive path 107B of active area 105B. Separation distance 134 is an initial separation distance between conductive path 107A and conductive path 107B and the trimmed isolating fin region 124.

Spacer 142A (gate electrode spacer) is over the top surface of the source portion 109A, aligned with first trim zone 116A, of active area 105A, and over the source portion 109D, but aligned with first trim zone 116A, of active area 105B. Spacer 142B is over the top surface of the drain portion 109C, but aligned with second trim zone 116B, of active area 105A, and over the top surface of drain portion 109E, aligned with second trim zone 116B, of active area 105B. In some embodiments, spacers 142A and 142B are silicon nitride, silicon oxy-nitride, or some other dielectric material which is configured to insulate contacts to a transistor from each other.

Figure 2:
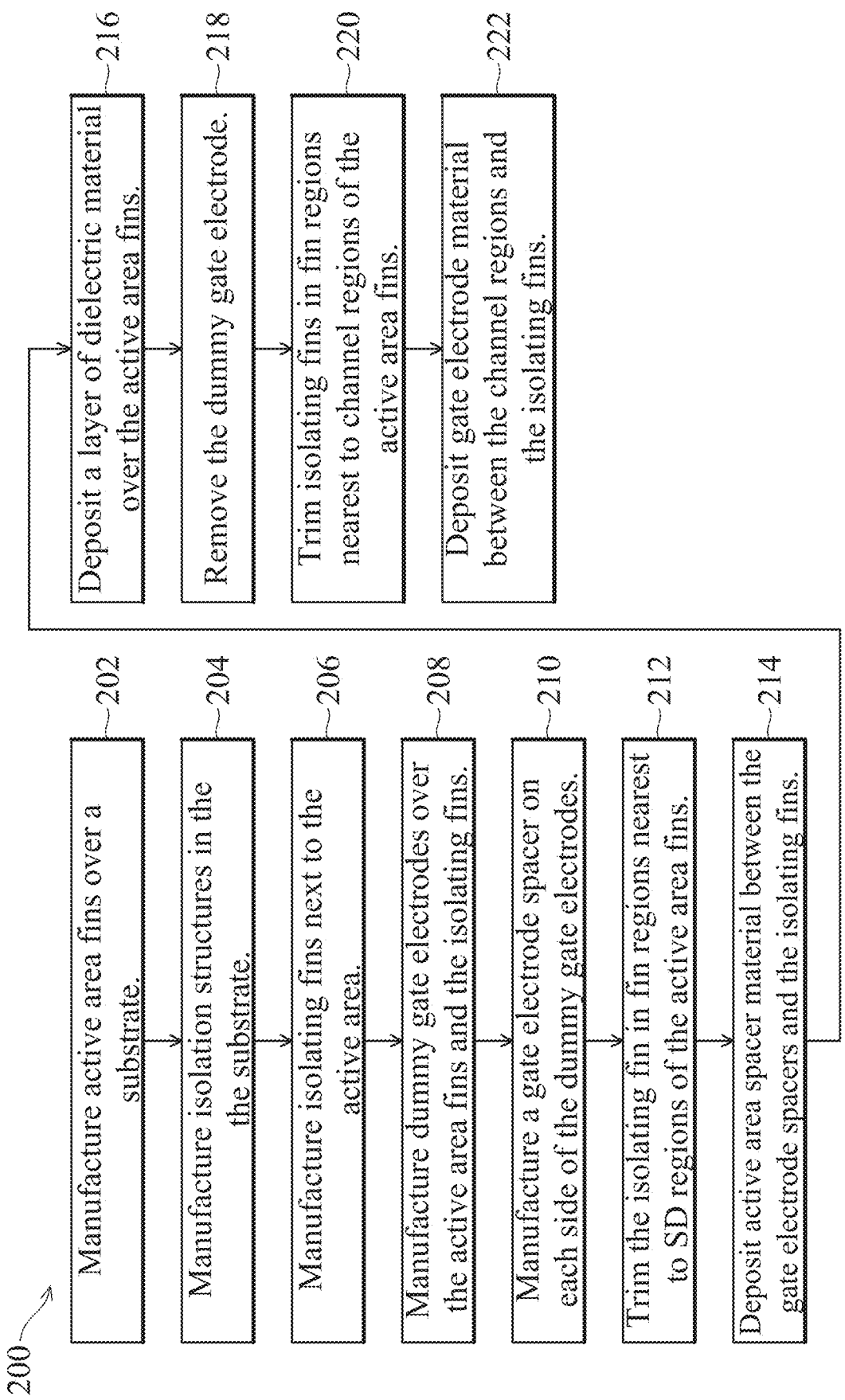
FIG. 2 is a flow diagram of a method for making a semiconductor device, in accordance with some embodiments.
Figure 3A:
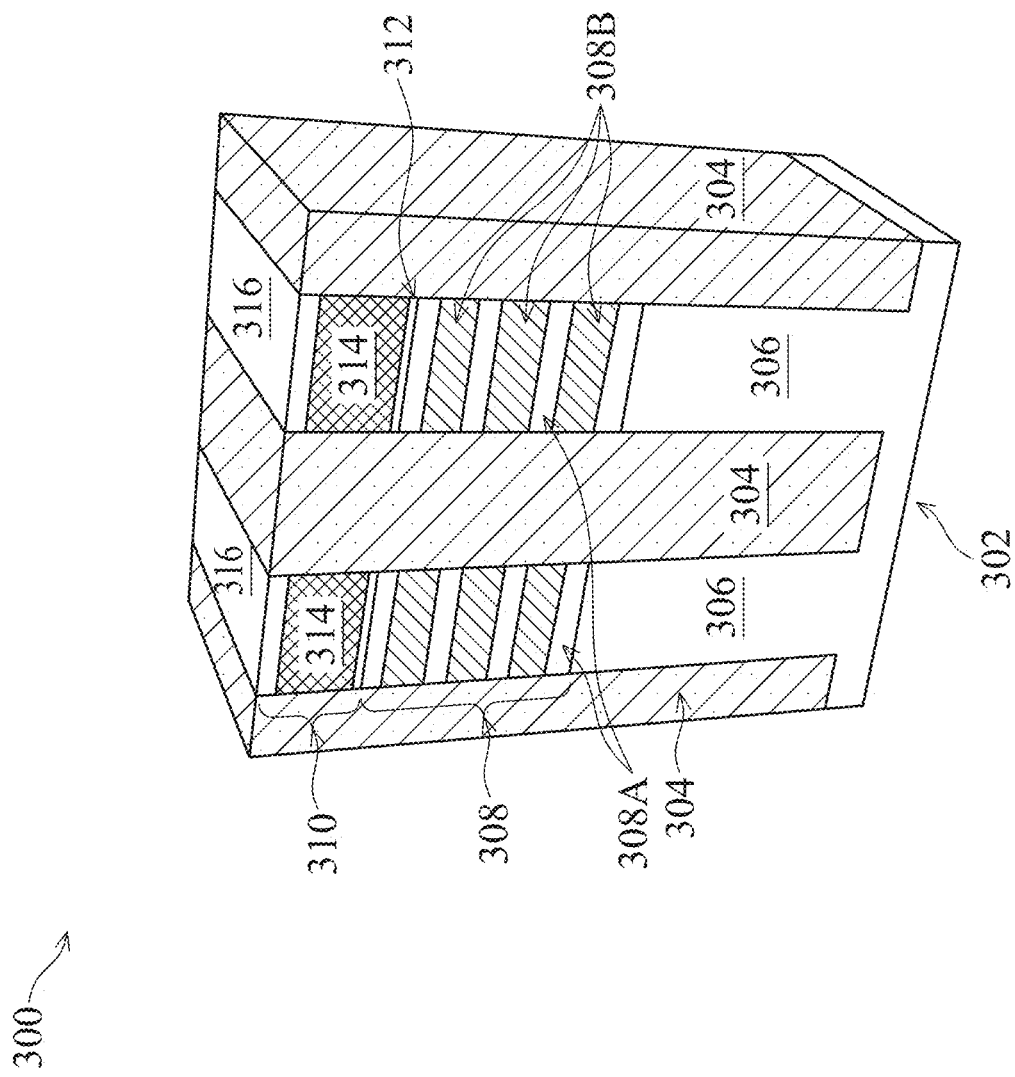
FIGS. 3A-3H are perspective views of a semiconductor device at various stages during a manufacturing process, in accordance with some embodiments.
Figure 3B:
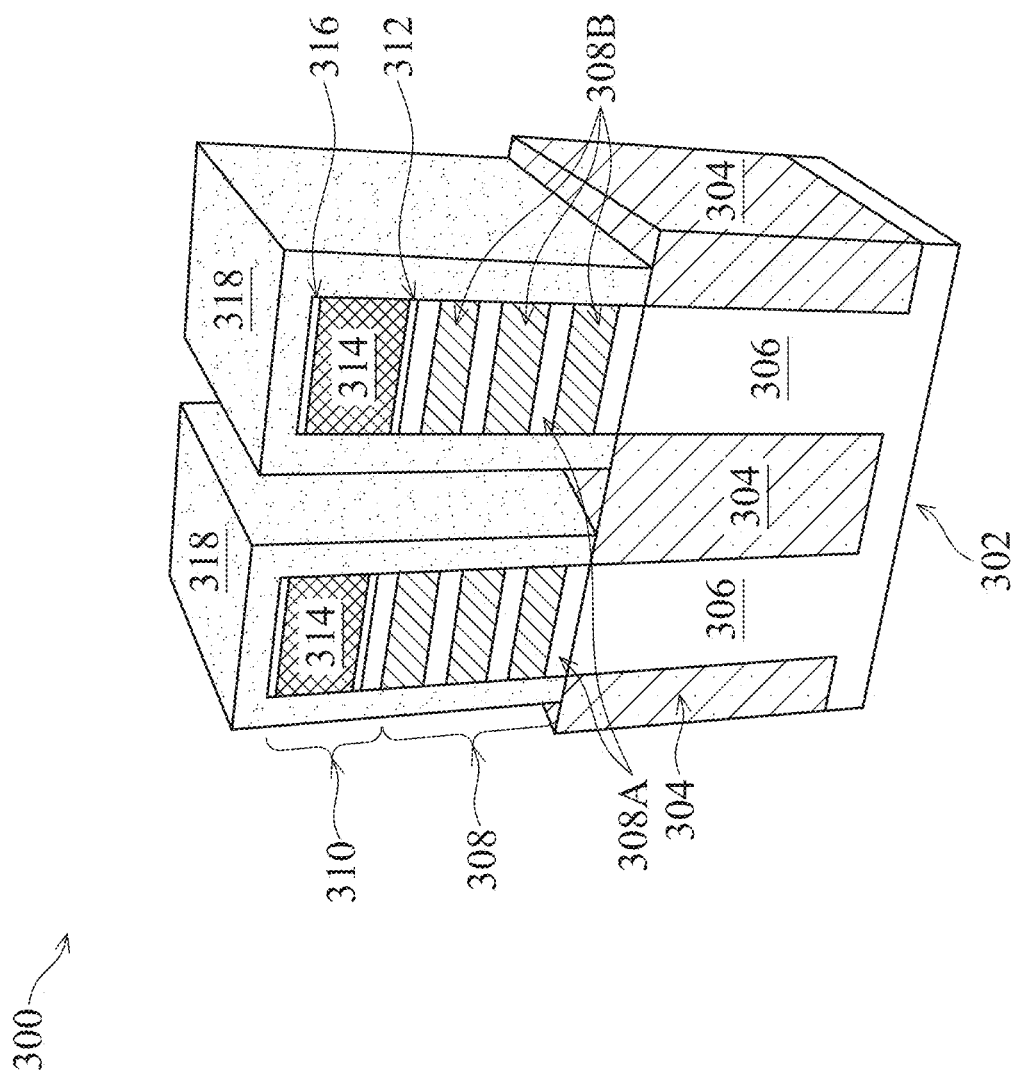

FIG. 2 is a flow diagram of a method 200 for making a semiconductor device, in accordance with some embodiments. Method 200 includes an operation 202 in which active area fins (see active area fin 308 in FIG. 3A) are manufactured over a substrate. FIGS. 3A and 3B, below, are diagrams of a semiconductor device 300 manufactured according to embodiments method 200. The semiconductor device 300 resembles the semiconductor device 100 described above in FIGS. 1A-1B, although the numbering of device elements in semiconductor device 100 and semiconductor device 300 are different from each other.

Operation 202 includes steps related to the manufacture of active area fins, including steps related to depositing alternating layers of semiconductor materials, depositing hardmask layers and etching the hardmask layer sand layers of semiconductor materials to expose the substrate below the layers of semiconductor material. In operation 202, a plurality of alternating layers of a first semiconductor material (see first semiconductor material 308A) and a second semiconductor material (see second semiconductor material 308B) are deposited over a substrate 302. The first semiconductor material and the second semiconductor material are different semiconductor materials. The first semiconductor material is deposited over a substrate (see substrate 302 in FIG. 3A), and alternating layers of the first semiconductor material 308A separate alternating layers of the second semiconductor material 308B. The alternating layers of second semiconductor material 308B are the conductive paths (see the at least one conductive paths 107A of FIG. 1A) which form the source, drain, and channel regions of a transistor in semiconductor device 300. In some embodiments, the first semiconductor material has a higher etch rate than the second semiconductor material during, e.g., liquid etch processes, which allows for removal of the first semiconductor material 308A around the second semiconductor material 308B to form the opening for the GAA semiconductor device gate electrode.

In some embodiments, the first semiconductor material and the second semiconductor material are deposited by sputtering. In some embodiments, the first semiconductor material and the second semiconductor material are deposited by a chemical vapor deposition (CVD) process. In some embodiments, the first semiconductor material and the second semiconductor material are deposited by a physical vapor deposition (PVD) process. In some embodiments, layers of the second semiconductor material are deposited to a greater (vertical) thickness than the layers of the first semiconductor material. In some embodiments, layers of the first semiconductor material are deposited to a greater (vertical) thickness than the layers of the second semiconductor material. In some embodiments, the first semiconductor material is silicon (Si), silicon germanium (SiGe), gallium arsenide (GaAs), or another semiconductor material compatible with a GAA semiconductor device. In some embodiments, the second semiconductor material is silicon (Si), silicon germanium (SiGe), gallium arsenide (GaAs), or another semiconductor material compatible with a GAA semiconductor device, and is a different semiconductor material from the first semiconductor material.

Operation 202 further comprises depositing hardmask layers over the first semiconductor material and the second semiconductor material. In some embodiments, depositing the hardmask layers includes depositing an oxide hardmask layer directly over one of the first layer of semiconductor material and one of the second layer of semiconductor material. In some embodiments, the oxide hardmask layer includes silicon dioxide or a high-k hardmask. In some embodiments, the oxide hardmask is deposited by a CVD process.

In some embodiments, depositing the hardmask layers includes depositing a nitride hardmask layer over the oxide hardmask layer. In some embodiments, the nitride hardmask layer is deposited by a CVD process. In some embodiments, the nitride hardmask layer is deposited by a sputtering process from a target having the nitride material.

In some embodiments, depositing the hardmask layers includes depositing a silicon hardmask layer over the nitride hardmask layer. In some embodiments, the silicon hardmask layer is a layer of sputtered or CVD-deposited silicon (Si). According to some embodiments, the order of depositing hardmask layers is different than described herein, as will be understood by a person of ordinary skill in view of different manufacturing integration schemes. In some embodiments, the method includes depositing multiple hardmasks in a sequence which is configured to protect underlying layers of material (e.g., of the first semiconductor material and the second semiconductor material) during the method. In some embodiments, the method includes operations of depositing an oxide hardmask layer, a nitride hardmask layer, and a silicon hardmask layer over the layers of semiconductor material.

Operation 202 includes steps associated with etching the hardmask layers and layers of semiconductor materials to expose the substrate below the layers of semiconductor material. Steps associated with etching the hardmask layers and layers of semiconductor materials into active area fins include steps for depositing a layer of patterning material over the hardmask layers, transferring a pattern to the layer of patterning material, exposing the topmost surface (e.g., the topmost hardmask layer below the layer of patterning material) below the layer of patterning material, and performing an etch process, or multiple etch processes, to expose the substrate below the layers of semiconductor material of the semiconductor device.

In some embodiments, depositing a layer of patterning material includes steps related to depositing a layer of ultraviolet (UV) lithography-compatible material. According to some embodiments, depositing a layer of patterning material includes steps related to depositing a layer immersion lithography-type photoresist. In some embodiments, depositing a layer of patterning material includes steps related to depositing an inorganic mask layer and patterning the inorganic mask layer with multiple lithography/etch steps to produce a self-aligned double patterning (SADP) mask for the etch process. In some embodiments, depositing a layer of patterning material incudes steps related to depositing an inorganic mask layer and patterning the inorganic mask layer with multiple lithography/etch steps to produce a self-aligned quadruple patterning (SAQP) mask for the etch process.

Operation 202 includes steps associated with transferring a pattern to the layer of patterning material include performing a pattern transfer process such as UV-lithography, immersion photolithography, and so forth.

In some embodiments, operation 202 includes steps related to etching active area fins through openings in the layer of patterning material. In some embodiments, the etch process is an anisotropic etch process which changes process conditions according to the material exposed through the opening in the layer of patterning material to remove the exposed material. In some embodiments, etching active area fins includes changing the etch process conditions for each type of material exposed. In some embodiments, etching the active area fins includes processes which passivate sidewalls of the active area fins during the etch process to reduce material loss and to preserve a dimension of the active area fin during the etch process. In some embodiments, etching active area fins includes performing a plasma etch process. In some embodiments, etching active area fins includes performing a liquid etch process to remove layers of material and/or residues from a previous etch step, and/or to clean the surface of the semiconductor device.

In some embodiments, a first set of etch steps is performed in order to remove material from the hardmask layers in the areas exposed in openings through the layer of patterning material. According to some embodiments, a different etch chemistry is used for etching each layer of the hardmask layers. In some embodiments, a silicon hardmask layer is etched using a solution of hydrofluoric acid to remove a silicon hardmask layer. In some embodiments, a silicon hardmask layer is etched using a fluorine-containing mixture of ionized etch gasses to remove a silicon hardmask layer. In some embodiments, a wet etch is performed to remove a layer of nitride hardmask layer. In some embodiments, a nitride hardmask layer is removed using an aqueous solution of phosphoric acid ($H_3PO_4$). In some embodiments, a nitride hardmask layer is etched using a plasma comprising ionized carbon tetrafluoride ($CF_4$) or nitrogen trifluoride ($NF_3$), oxygen, and nitrogen. In some embodiments, an oxide hardmask layer is etched using a dilute solution of hydrofluoric acid (HF) or some other suitable etchant. In some embodiments, an oxide hardmask layer is etched using a plasma containing fluorine ions and/or fluorine radicals accelerated onto the surface of the semiconductor device during the etch process.

In some embodiments, layers of semiconductor material are etched using fluorine-containing plasma or chlorine-containing plasma with an anisotropic etch to preserve active area fin dimensions in relation to the opening through the layer of patterning material. In some embodiments, the substrate is a bulk doped (N-doped or P-doped semiconductor material) semiconductor material which is against a bottom of the lowest layer of the first semiconductor material. In some embodiments, a dielectric material (not shown) is between the substrate and the bottom-most layer of first semiconductor material.

Method 200 includes an operation 204 in which isolation structures are manufactured in the substrate. According to some embodiments, a layer of dielectric material is deposited over the active area fins formed in operation 202, and in between the active area fins to fill the openings in the substrate and between the active area fins. The dielectric material in the openings in the substrate acts as shallow trench isolation (STI) structures. In some embodiments, the layer of dielectric material is silicon dioxide or a low-k dielectric material. In some embodiments, the layer of dielectric material is deposited by a CVD-type process or a spin-deposition process (as is used for some low-k dielectric materials).

Method 200 includes an operation 206 in which isolating fins are manufactured next to the active area fins. In some embodiments, the dielectric material deposited in operation 204 (between the active area fins and in the openings in the substrate) is recessed to be below the bottom-most layer of semiconductor materials (e.g., in FIG. 3B, the top surface of the isolation structure 304 is at a same level as the top of the substrate pillars 306 and the bottom of the bottom-most layer of first semiconductor material 308A).

Operation 206 includes steps associated with depositing a layer of the first semiconductor material over the tops and sides of the active area fins, down to the top surface of the isolation structures (e.g., isolation structure 304 in FIG. 3B) between the substrate pillars (see substrate pillar 306 in FIG. 3B). In some embodiments, the layer of the first semiconductor material is deposited by a chemical vapor deposition process or an atomic layer deposition (ALD) process. In some embodiments, the layer of first semiconductor material is deposited in a conformal layer, and the portion of the conformal layer of first semiconductor material at the top surface of the isolation structure (e.g., isolation structure 304) is removed by an isolation etch process. In some embodiments, the layer of first semiconductor material is deposited by ALD in a conformal manner, but there is no growth of the layer of the first semiconductor material on the isolation structures between the substrate pillars because of the deposition characteristics of the deposition process. In some embodiments, the layer of first semiconductor material is a layer of silicon (Si), silicon germanium (SiGe), or gallium arsenide (GaAs), or another semiconductor material matching the composition of the semiconductor material between the top surface of the substrate pillar and the bottom-most layer of second semiconductor material in the active are pillars.

Operation 206 includes steps associated with depositing dielectric material between the active area fins. In some embodiments, a sacrificial dielectric material is deposited in a conformal film against the top surface and the sides of the first semiconductor material at the sides of the active area fins, and against the top surface of the isolation structures between the substrate pillars. In some embodiments, the sacrificial dielectric material is deposited by an ALD process in a conformal fin. In some embodiments, the sacrificial dielectric material is silicon dioxide, with a dielectric constant of 3.9. In some embodiments, the sacrificial dielectric material is a high-k dielectric material with a dielectric constant (k) of greater than 3.9 (the dielectric constant of silicon dioxide). In some embodiments, the sacrificial dielectric layer has a thickness ranging from about 1 nm to about 5 nm. For sacrificial dielectric layer thicknesses smaller than about 1 nm, the opening formed for, e.g., an active area spacer (see active area spacer 119A in FIG. 1A, above), is prone to having voids because of the small dimensions. Sacrificial dielectric layer thicknesses greater than about 5 nm are large enough that filling problems for forming, e.g., active area spacers, are reduced. However, the larger dimensions increase the area for transistors in the semiconductor device, increasing manufacturing cost. In some embodiments, the active area spacer has a thickness ranging from about 1 nm to about 10 nm. Active area spacer thicknesses smaller than about 1 nm are prone to uneven coverage and increased potential for short circuits or crosstalk between devices. Active area spacer thicknesses larger than about 10 m are associated with increased die area and increased manufacturing costs.

In some embodiments, forming an isolating fin includes steps associated with depositing a dielectric fill material over the sacrificial dielectric material. In some embodiments, forming an isolating fin includes depositing silicon dioxide as the dielectric fill material. In some embodiments, forming an isolating fin includes depositing a low-k dielectric fill material (with a dielectric constant (k) of less than 3.9) as the dielectric fill material. In some embodiments, forming an isolating fin includes depositing a high-k dielectric material as the dielectric fill material. In some embodiments, the high-k dielectric material is formed by continuing the deposition of the sacrificial dielectric material until the opening between the active area fins is completely filled with sacrificial dielectric material.

Forming the isolating fins between the active area fins includes steps associated with performing a chemical mechanical polishing (CMP) step to remove portions of the sacrificial dielectric material and/or the dielectric fill material from the top surface of the active area fins (or, from the layer of the first semiconductor material which covers the active area fins). In some embodiments, after the CMP process, the first semiconductor material at the top of the active area, and the dielectric fill material, and the sacrificial dielectric material, are exposed.

In some embodiments of operation 206, the dielectric fill material is recessed and a second dielectric fill material is deposited into the recess between the portions of sacrificial dielectric material. In FIG. 3D, semiconductor device 300 includes an isolating fin with two dielectric fill materials, as described below.

In some embodiments of operation 206, manufacturing an isolating fin includes operations associated with recessing the dielectric fill material ad depositing a second dielectric fill material on a sacrificial isolation material in an upper portion of the isolating fin, while leaving unmodified the dielectric fill material of the bottom portion of the isolating fin. In some embodiments of operation 206, depositing a second dielectric fill material on a sacrificial isolation material in an upper portion of the isolating fin includes depositing a second dielectric material different from the dielectric material in the lower portion of the isolating fin. In some embodiments, depositing a second dielectric fill material includes depositing a high-k dielectric material. In some embodiments, depositing a second dielectric fill material includes depositing silicon dioxide.

Method 200 includes an operation 208 in which dummy gate electrodes are manufactured over the active area fins and the isolating fins. FIGS. 3D and 3E are diagrams of a semiconductor device, in accordance with some embodiments described herein. In some embodiments, manufacturing dummy gate electrodes over the active area fins includes steps associated with removing hardmask layers from the active area fins. In some embodiments, hardmask layers are removed by a liquid etch process. In some embodiments, hardmask layers are removed by a plasma etch. In some embodiments, hardmask layers are removed by a combination of plasma etch and liquid etch processes, to preserve selectivity with regard to the sacrificial dielectric material of the isolating fin and with regard to the semiconductor materials of the active area fins. Details of etching hardmask layers are provided above in the description of operation 202. Hardmask layers are removed to expose the top surface of the semiconductor materials of the active area fins. In some embodiments, a liquid etch is performed to clean the top surface of the semiconductor materials by removing surface oxidation form the exposed semiconductor material.

Operation 208 includes steps associated with forming a dummy gate which include: [1] depositing a blanket layer of dummy gate material over the active area fins and the isolating fins, [2] depositing hardmask layers over the blanket layer of dummy gate material, [3] depositing a layer of patterning material over the hardmask layers, [4] transferring a pattern to the layer of patterning material, [5] exposing the top surface of the hardmask layers through openings in the layer of patterning material, (steps 3-5, above, comprise a "patterning process"), and [6] etching dummy gate fins through the openings in the layer of patterning material.

In some embodiments, depositing a blanket layer of dummy gate material includes depositing a layer of semiconductor material, such as silicon or silicon germanium, over the active area fins and the isolating fins. Silicon or silicon germanium dummy fin material is deposited by, e.g., a chemical vapor deposition (CVD) process. In some embodiments, a CMP step is performed after depositing the dummy gate material to provide a flat surface for subsequent deposition steps and to reduce focus problems with photolithography or UV lithography operations to pattern the semiconductor device in the manufacturing process. In some embodiments, hardmask layers are deposited over the dummy gate material and after the CMP process. In some embodiments, the hardmask includes a single layer. In some embodiments, multiple hardmask layers are deposited to provide manufacturing robustness and to protect dummy gate material in subsequent etch steps. In some embodiments, the hardmask includes an oxide layer, a nitride layer, and/or combinations thereof.

In some embodiments, a patterning process is performed followed by a series of plasma etch steps to produce dummy gate lines which extend perpendicularly over the isolating fin and the active areas of the semiconductor device. Representative details of methods of patterning and etching hardmask layers and dummy gate materials (e.g., semiconductor material) are provided above.

Method 200 includes an operation 210 in which a gate electrode spacer is manufactured on the sides of the dummy gate electrode. Manufacturing a gate electrode spacer over the dummy gate includes depositing a gate electrode spacer material (spacer material) over the tops and sides of the dummy gate using, e.g., a CVD process or an ALD process. Manufacturing the gate electrode spacer over the dummy gate produces a conformal fin to facilitate circuit matching in a semiconductor device by providing even thicknesses for contacts and the gate electrode. In some embodiments, the spacer is a nitride material, such as silicon nitride or silicon oxy-nitride deposited during a CVD process during method 200.

Method 200 includes an operation 212 in which the isolating fin is trimmed in fin regions nearest to the SD regions of the active area fins. Trimming the isolating fin includes steps related to [1] exposing the channel of the conductive path in the transistor, and [2] performing an etch process to remove a portion of the sacrificial dielectric material of the isolating fin. In operation 212, the channel region of a transistor active area is exposed by etching the second semiconductor material from around the first semiconductor material (e.g., the conductive paths from source to drain of the transistor). In some embodiments, a plasma etch process is used to etch the first semiconductor material around the channel regions, while leaving the second semiconductor material extending between the source region and the drain region of the transistor. In some embodiments, the plasma etch process leaves some of the first semiconductor material between the conductive paths in the channel region, and a wet etch process is used in order to provide increased efficiency at removing the first semiconductor material from between the conductive paths of the semiconductor device. In some embodiments of the present disclosure, a trim process is performed to truncate the active area fin into plurality of transistor active areas at the same time that the channel regions of the transistor active area are exposed. In some embodiments of the present disclosure, the process of truncating the active area into a plurality of transistor active areas, and the process of exposing the channel region of the conductive paths within a transistor active area are performed in separate etch processes.

A liquid etch process is performed to remove a portion of the sacrificial dielectric material on the outer portion of the isolating fin. In some embodiments, the liquid etch process recesses the sacrificial dielectric material between the isolating fin (or, the dielectric fill material thereof) and the first semiconductor material which remains a SD region of the active area. The recess of the sacrificial dielectric material by the wet etch provides a sheltered volume between the sacrificial dielectric material remaining between a SD region of the transistor and the dielectric fill material of the isolating fin. The sheltered volume is subsequent filled with a dielectric material to form an active area spacer in operation 214, below. The chemistry of the liquid etch process is adjusted to be selective to the first semiconductor material, the second semiconductor material, and the dielectric fill material, preserving dimensions of the semiconductor device during the manufacturing process. In some embodiments, recessing the sacrificial dielectric material produces a sheltered volume which extends along the entire height of the isolating fin, from the top edge adjacent to the gate electrode spacer, to the bottom edge adjacent to the isolation structure (between the dielectric fill material and the dielectric material of the isolation structure). In some embodiments, recessing the sacrificial dielectric material also produces a sheltered volume between the top edge isolating fin and the gate electrode spacer.

Recessing the sacrificial dielectric material increases the separation distance (see, e.g., separation distance 140 between trimmed isolating fin region 124 and conductive path 110A of FIG. 1B, which is larger than separation distance 139 between untrimmed isolating fin 112 and conductive path 110A).

Method 200 includes an operation 214 in which an active area spacer is deposited between the gate electrode spacers and the isolating fins. In operation 214, an active area spacer material is a different dielectric material than the sacrificial dielectric material, and is more resistant to later etch processes in the manufacture of a semiconductor device than the sacrificial dielectric material. In some embodiments, active area spacers comprise an electrically insulating inorganic nitride, such as silicon dioxide, silicon nitride, silicon oxy-carbide, silicon oxy-nitride, and so forth. In some embodiments, the active area spacers are multi-layered structures, having combinations of silicon dioxide, silicon nitride, silicon oxy-nitride, and/or silicon oxy-carbide. In some embodiments, a larger concentration of nitrogen increases the etch resistance of the active area spacer material with respect to the sacrificial dielectric material and/or the gate electrode spacer material. In some embodiments, a blanket layer of active area spacer material is deposited over the gate electrode spacer and fills the sheltered volume, and the majority of the active area spacer material is removed (by, e.g., a plasma etch process or a liquid etch process), leaving behind the active area spacer in the sheltered volume between gate electrode spacers and isolating fins. According to some embodiments of the present disclosure, a plasma etch process for removing the bulk of the active area spacer material from the semiconductor device has a low impact energy on the surface of the semiconductor device, to reduce damage to the first semiconductor material or the second semiconductor material exposed in the channel region of the active area. In some embodiments, a liquid etch process is used to remove the bulk of the active area spacer material because liquid etches of dielectric materials are highly selective with regard to unoxidized semiconductor material.

Method 200 includes an operation 216 in which a layer of dielectric material is deposited over the active area fins. In some embodiments of the present disclosure, dielectric material (see dielectric material 342 FIG. 3G) is deposited over the active area fins by a chemical vapor deposition (CVD) process. In some embodiments, the dielectric material deposited by the active area fins (or, transistor active areas) silicon dioxide ($SiO_2$), or a low-k dielectric material. In some embodiments, a low-k dielectric material is deposited by chemical vapor deposition. In some embodiments, a low-k dielectric material is deposited by a spin-on technique followed by a process to remove solvent. In some embodiments, the dielectric material deposited over the active area fins or over the transistor active areas fills volumes which are present transistor active areas after an active area fin has been truncated into a plurality of transistor active areas. The dielectric material deposited over the transistor active areas extends from a top edge of the isolating fin down to the isolation structure and/or the substrate pillar below the transistor active area. In some embodiments, subsequent to the deposition of a dielectric material, and hard mask material (see dielectric hardmask 344 in FIG. 3G) is deposited over the top surface of the dielectric material in order to protect the dielectric material from subsequent operations until source/drain (SD) contacts are being formed. In some embodiments, a dielectric liner (see dielectric liner 340 FIG. 3G) is deposited prior to deposition of the dielectric material. According to some embodiments, dielectric liner is a different dielectric material than the gate electrode spacer. In some embodiments, dielectric liner is the same material as the gate electrode spacer.

Method 200 includes an operation 218, in which dummy gate electrode is removed and channel regions of active area fins are exposed. The dummy gate electrode manufactured in operation 208 is removed in order to expose the channel region of the conductive paths within active area. According to some embodiments the gate electrode is removed by performing a series of etch processes which remove the hardmasks at the upper end of dummy gate electrode while leaving the gate electrode spacer in place to extend over the isolating fins and transistor active areas of the semiconductor device. Removal of the dummy gate electrode to expose the channel regions of the conductive paths in transistor active areas is performed by, e.g., a selective plasma etch process or a liquid etch process which selectively removes the dummy gate electrode material, while leaving the second semiconductor material of the conductive paths behind. In some embodiments, the gate electrode spacer extends from the top surface of the isolating fins down to a top surface of the active area, and down to isolating material substrate pillars below transistor active areas. In some embodiments, the gate electrode spacer extends from the top surface of the isolating fins down to a top surface of the active area, and is against the substrate.

Method 200 includes an operation 220, in which isolating fins in fin regions nearest to the channel regions of the transistor active areas are trimmed. Trimming the isolating fins nearest to the channel region of transistor active area is performed in order to increase the separation distance between the channel region of the conductive path of the transistor active area and isolating fin in order to reduce the frequency of formation during gate electrode deposition. According to some embodiments, the trimming of the isolating fins is performed using a liquid etch process which is configured to selectively remove sacrificial dielectric material while leaving dielectric fill an interior portion undamaged. According to some embodiments, removing the sacrificial dielectric material from the isolating fin simultaneously removes oxidized material from the channel portion of the at least one conductive path extending through the transistor active area in preparation for deposition of gate dielectric material, as described below.

According to some embodiments, removing a portion of the sacrificial dielectric material extends partly through a first trim zone and a second trim zone results in portions of the sacrificial dielectric material approximately the width of the gate electrode spacer directly over the sacrificial dielectric layer in the semiconductor device. By recessing the sacrificial dielectric material partly through the first trim zone and the second trim zone (e.g., on the gate side trim regions in each of the trim zones), the active area spacer formed in the first trim zone and the second trim zone prevents the etch chemistry of the liquid etch (or, in some embodiments, a plasma etch) from extending through the first trim zone and the second trim zone and reduces the likelihood of a short circuit.

Method 200 includes an operation 222, in which gate electrode material is deposited between the isolating fins and the channel regions of the active area fins.

In operation 222, before gate electrode material deposition, a gate dielectric material is deposited over the channel portions of the conductive paths in the transistor active area. In some embodiments, the gate dielectric material is deposited by an ALD process. In some embodiments, the gate dielectric material is formed by steam oxidation, or some other oxidation process compatible with a GAA semiconductor device. In some embodiments, the gate dielectric material deposited by the ALD process is a high-k dielectric material with a dielectric constant (k) greater than about 3.9 (the dielectric constant of silicon dioxide). In some non-limiting embodiments, the gate dielectric material is hafnium oxide (HfO). In some embodiments of the semiconductor device where the gate electrode spacer does not extend from the top of the isolating fins to the bottom of the active area (e.g., down to the substrate pillar or isolation feature below the active area), deposition of gate dielectric material also covers the second semiconductor material remaining in the first trim zone and the second trim zone to prevent short circuits between the gate electrode and the SD contacts or SD regions of the transistor. In a GAA semiconductor device, the channel portions of the conductive path extend through an open volume, or open space, before gate dielectric material is deposited on the outer surface of the channel portions of the conductive path. Deposition of gate dielectric material follows the trimming of the isolating fin 112 in channel trim region 118A (or, the trim process etching chemistry would also remove the gate dielectric material from the channel portion (see channel portion 109B) of the conductive paths 107A). Deposition of gate dielectric material on the sides of the opening through which the channels extend provides another layer of dielectric material which provides electrical insulation of the gate electrode material from the source contact region 114A or the drain contact region 114B. In some embodiments, deposition of gate dielectric material on sides of the opening occurs, e.g., in the first trim zone 116A and the second trim zone 116B. In some embodiments, the gate dielectric material is deposited on "inner" surface of the second semiconductor material (e.g., the side closest to the channel portions 109B of the conductive paths 107A).

Gate electrode material is deposited into the volume between the trimmed isolating fin and the channel regions of the transistor active area by, e.g., a sputtering process. In some embodiments, the gate electrode material is a pure metal such as tungsten, titanium, cobalt, and so forth, or a metal alloy. The gate electrode material is compatible with a silicon dioxide or a high-k gate dielectric material. In some embodiments, the gate electrode material is deposited onto a heated substrate (e.g., the semiconductor device is heated during deposition) in order to promote diffusion of sputtered atoms into the volumes between the channel portions of the conductive paths in the GAA semiconductor device.

According to some embodiments, the SD region contacts are manufactured after the gate electrode material has been deposited. In some embodiments, the SD region contacts are manufactured before the gate electrode material is deposited, and are masked from the gate electrode material deposition.

Figure 3C:
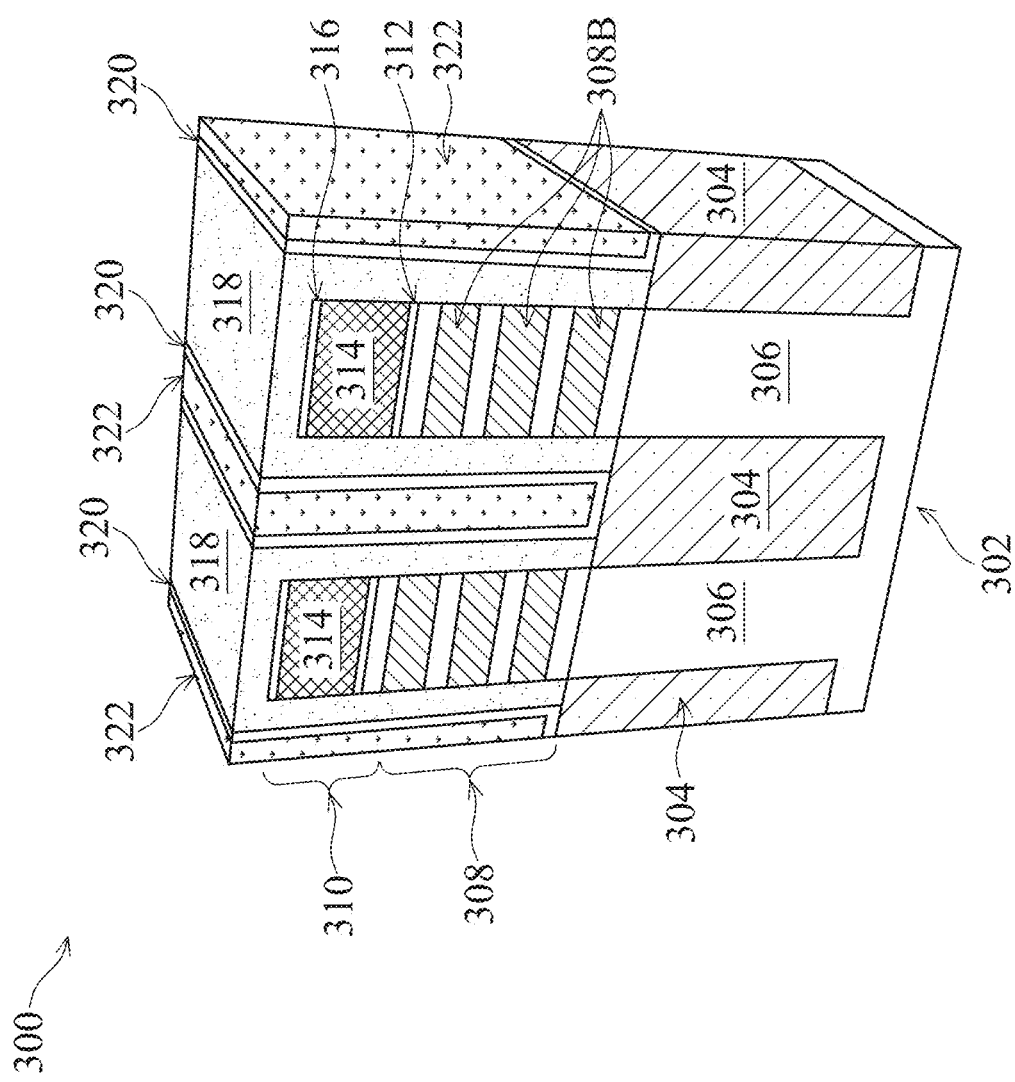
Figure 3D:
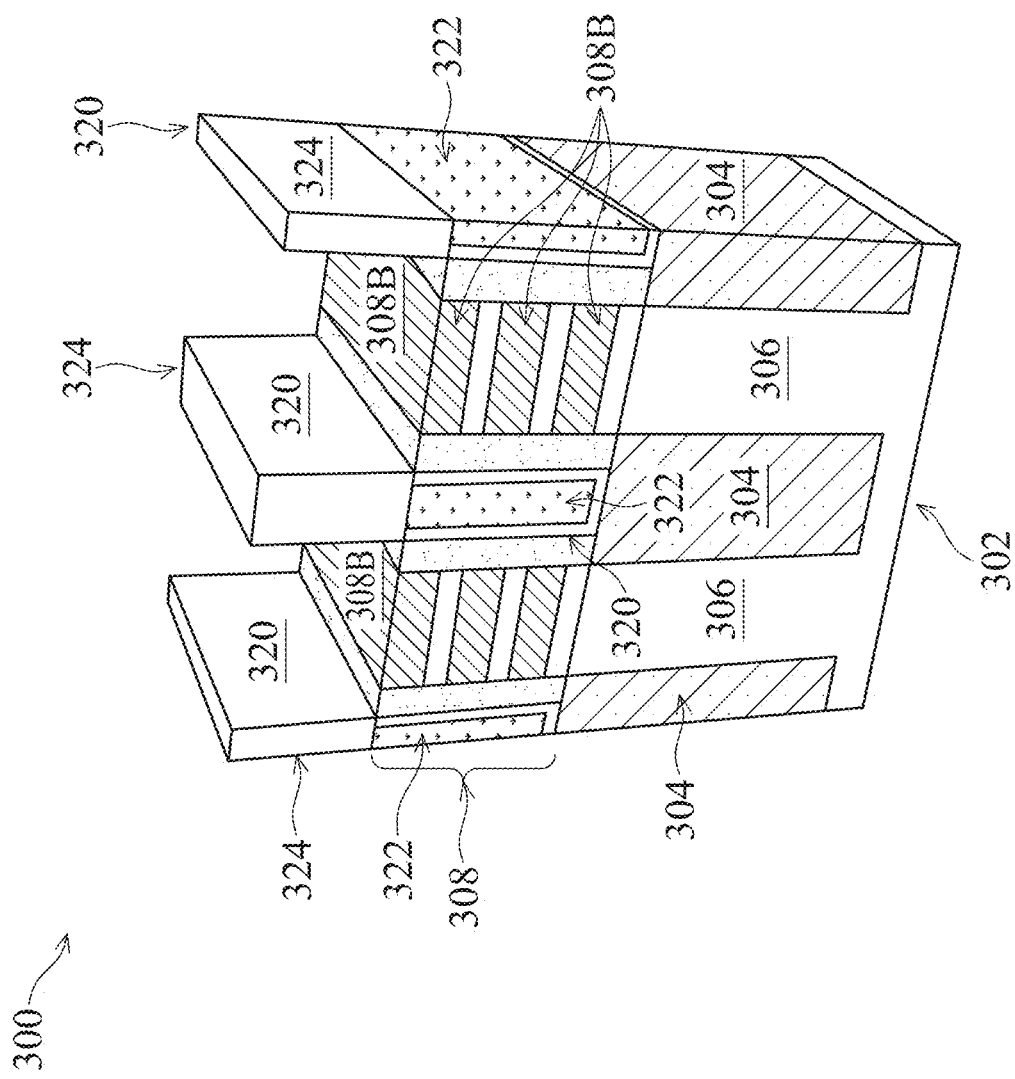
Figure 3E:
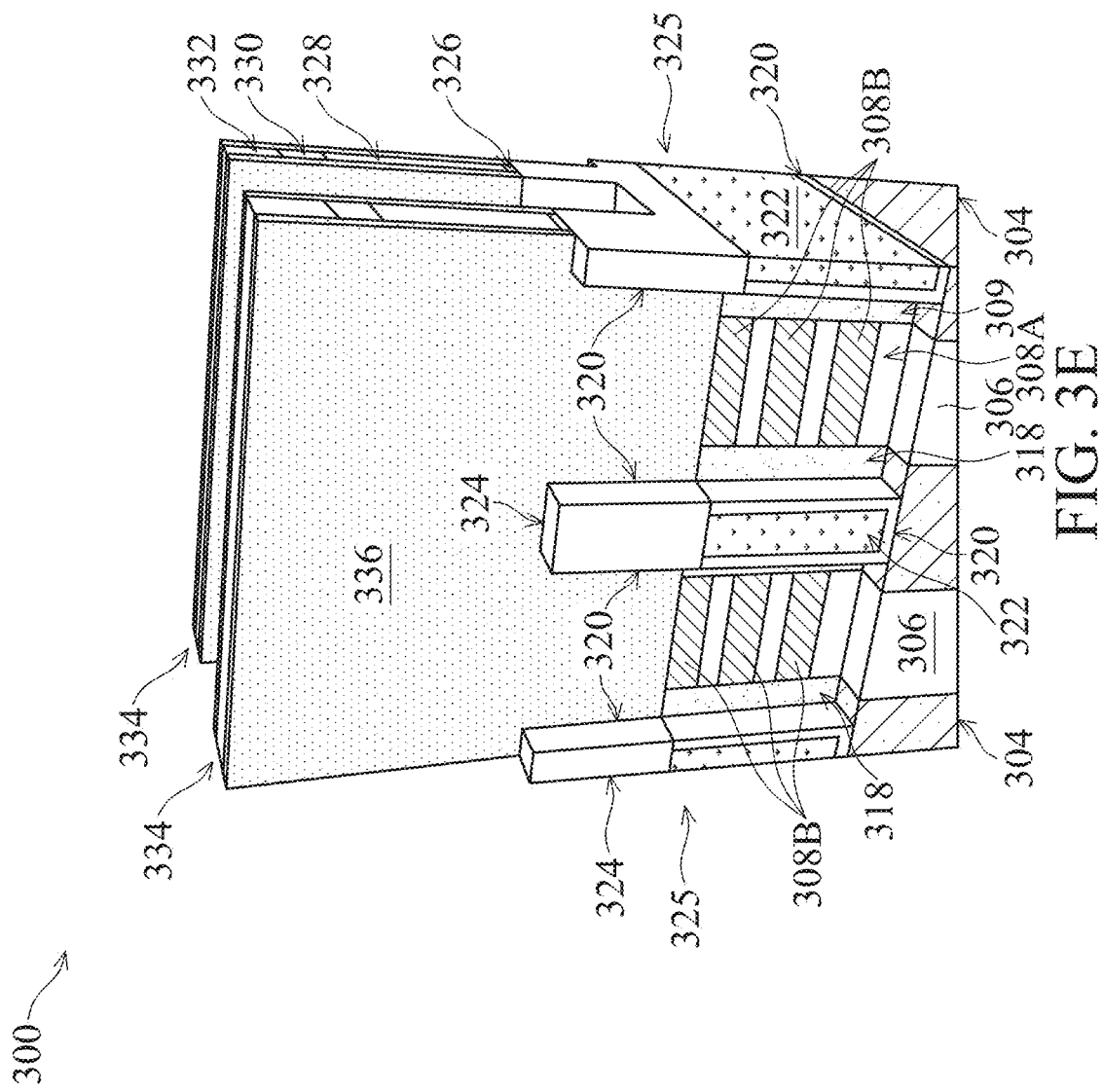
Figure 3F:
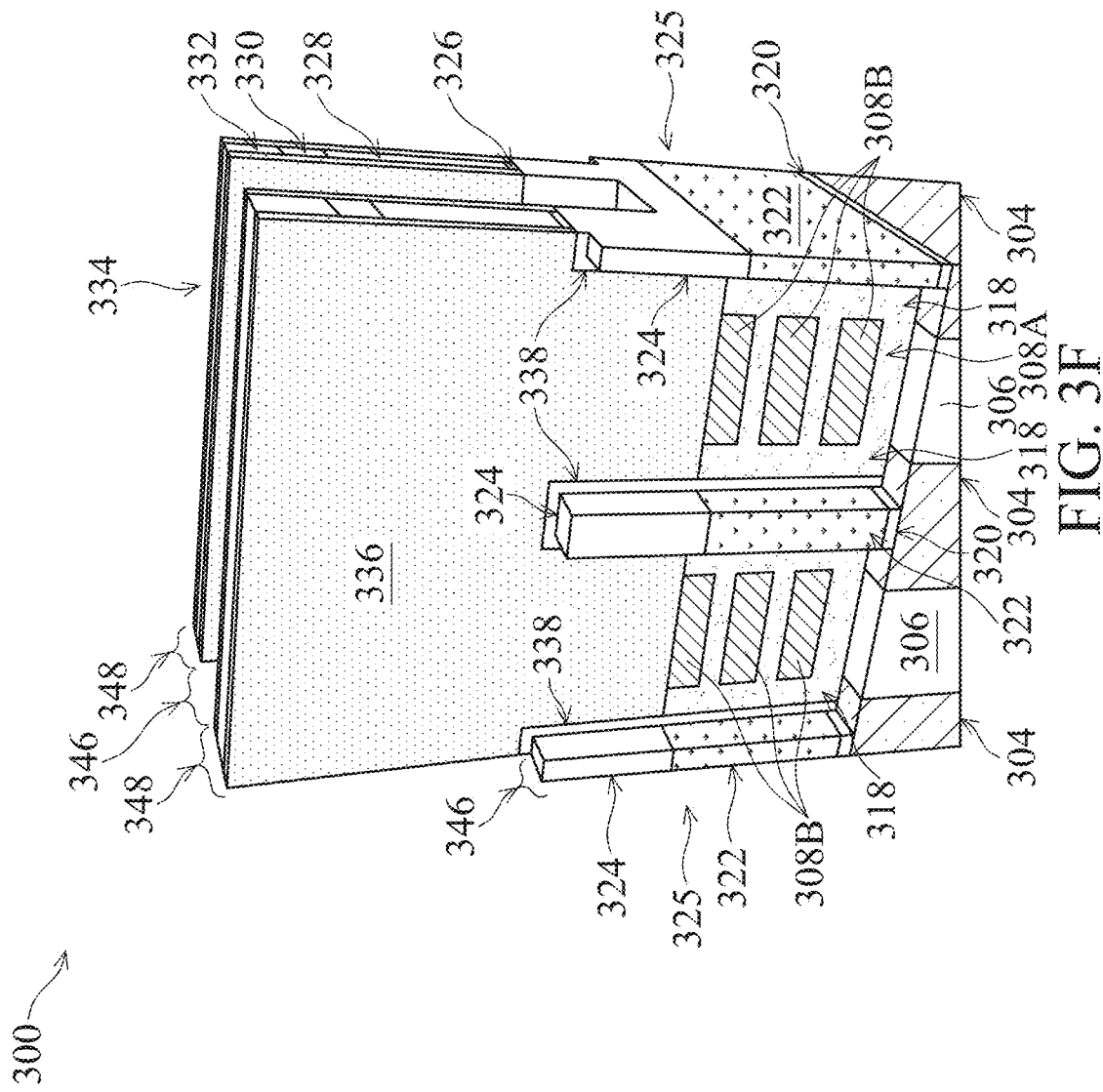
Figure 3G:
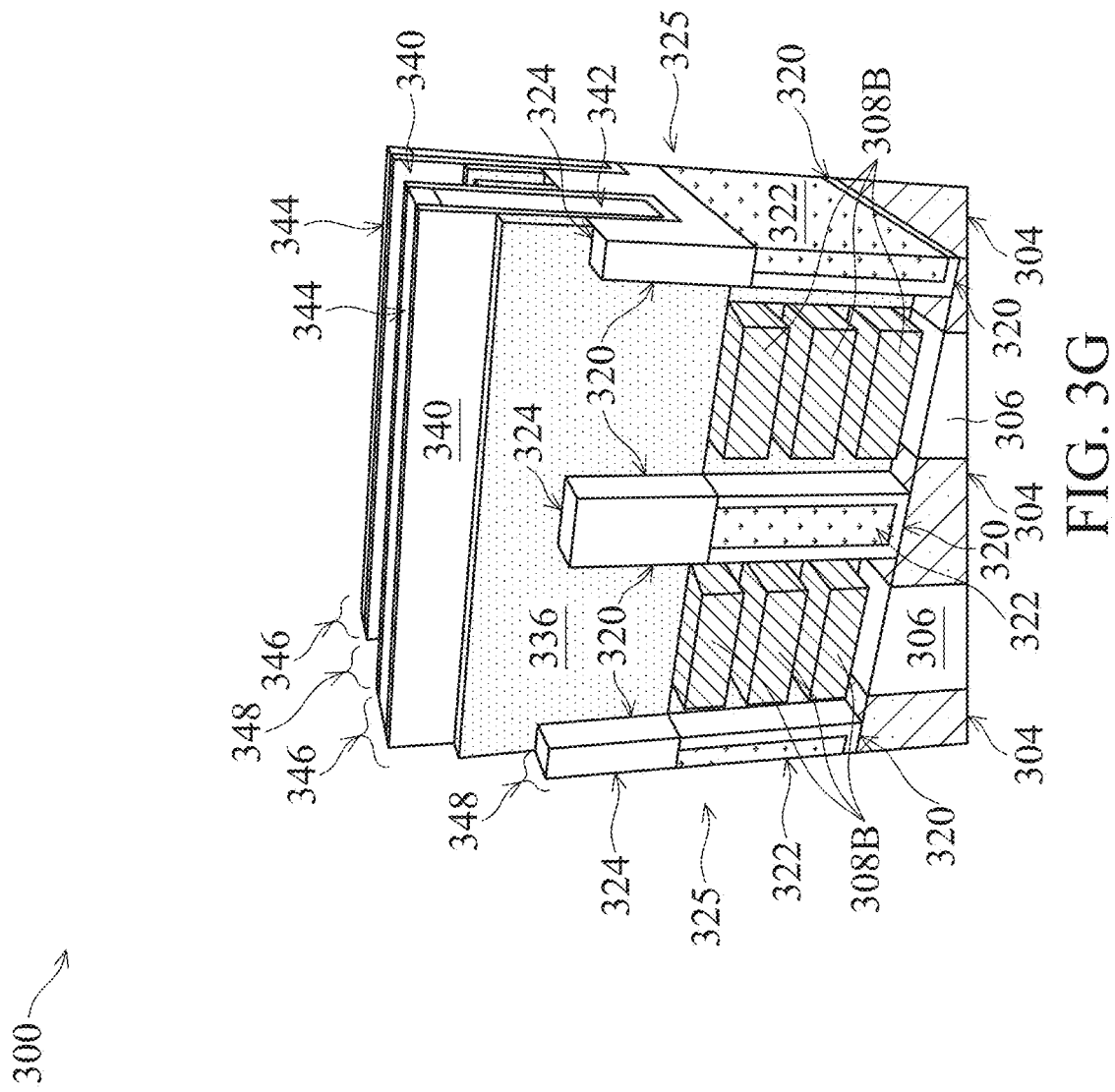
Figure 3H:
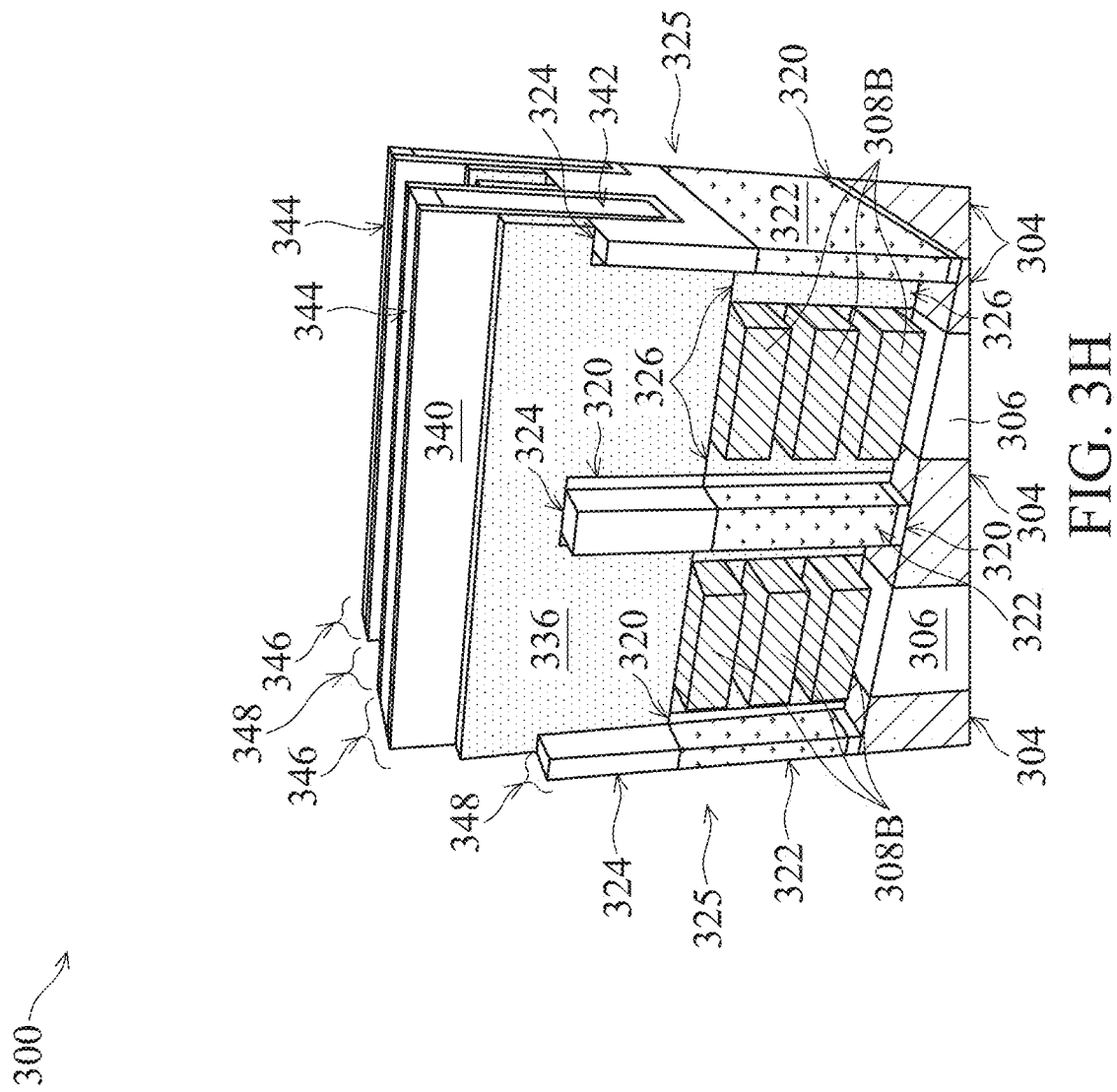

FIGS. 3A-3H are diagrams of a semiconductor device 300 during a manufacturing process, in accordance with some embodiments. In FIG. 3A, shallow trench isolation (STI) structures (see, e.g., isolation structures 304) and an active area fin 308 (active area fins) are being manufactured. Hardmask stack 310 is over a top surface of active area fin 308 in FIG. 3A and FIG. 3B. In FIG. 3B, the STI structures have been manufactured and the active area fins have been covered with a cap layer. In FIG. 3C, isolating fins are being manufactured next to the active area fins. In FIG. 3D, the isolating fins have been manufactured, and the hardmask layers (hardmask caps) at the tops of the active area fins have been removed, exposing semiconductor material in the active area fins. In FIG. 3E, dummy gate electrodes have been manufactured over the isolating fins and the active area fins, and the isolating fins are prepared for a trimming process. In FIG. 3F, an active area spacer has been deposited between the isolating fins and the active area fins. In FIG. 3G, a dielectric layer has been deposited over the active area fins, and the isolating fins in the channel regions of the active area fins are prepared for trimming. In FIG. 3H, the active area fins in the channel regions have been trimmed in preparation of forming the gate dielectric material on the channel regions prior to depositing the gate electrode material between the channel regions and the isolating fins.

FIG. 3A is a diagram of a semiconductor device 300 during a manufacturing process. Elements of semiconductor device 300 shown in FIG. 3A are formed during operations 202 and 204 of method 200, described above. In FIG. 3A, a substrate 302 has been etched to form substrate pillars 306 with isolation structures 304 extending therebetween. The material of the isolation structure 304 extends from the bottom of the substrate pillar 306 to the top of the topmost hardmask layer. In some embodiments, the isolation structures extend around a perimeter of the substrate pillars. In some embodiments, the isolation pillars extend along the sides of the substrate pillars, but not around the ends thereof. In FIG. 3A, four layers of a first semiconductor material 308A have been deposited over the semiconductor pillars 306, and three layers of a second semiconductor material 308B have been deposited, between the layers of first semiconductor material 308A. Thus, the layers of first semiconductor material 308A and the layers of second semiconductor material 308B alternate. One of ordinary skill in the art would understand that a different number of layers is within the scope of this disclosure. In FIG. 3A, a first hardmask layer 312 is deposited over a top surface of the topmost layer of first semiconductor material 308A. A second hardmask layer 314 is deposited over the first hardmask layer. A third hardmask layer is deposited over the top surface of the second hardmask layer. In some embodiments, there is less than three hardmasks present on the top of the layers of semiconductor material.

In some embodiments, the hardmask layers include a nitride hardmask, an oxide hardmask, a semiconductor hardmask, and/or a carbide hardmask. In some embodiments, the nitride hardmask is silicon nitride or silicon oxy-nitride. In some embodiments, the oxide hardmask is a layer of silicon dioxide or a high-k dielectric material. In some embodiments, the semiconductor hardmask is a layer of polysilicon or silicon germanium. In some embodiments, the carbide hardmask is a layer of silicon carbide (SiC) or silicon oxy-carbide (SiOC). A person skilled in the art will recognize the scope of other hardmask materials compatible with a GAA semiconductor device integration scheme.

FIG. 3B is a diagram of a semiconductor device 300 during a manufacturing process. In FIG. 3B, the dielectric material of isolation structures 304 is recessed to the bottom of the bottom-most layer of the first semiconductor material 308A. A semiconductor device 300 as described by FIG. 3A is transformed into the semiconductor device as described by FIG. 3B by operation 204 of method 200. A semiconductor cap layer 318 covers the sides and the top of the active area fin (e.g., the alternating layers of first semiconductor material 308A and second semiconductor material 308B) and the hardmask layers 312-316 at the top of the active area fin. Deposition of the semiconductor cap layer 318 is described in operation 206, above. In some embodiments, an etch process is performed to remove the semiconductor cap layer 318 from the top surface of isolation structures 304 between substrate pillars 306.

FIG. 3C is a diagram of a semiconductor device 300 during a manufacturing process. In FIG. 3C, a layer of sacrificial dielectric material 320 is deposited on the sides of the semiconductor cap layer 318 and on the top surface of the isolation structure 304. In some embodiments, depositing a layer of sacrificial dielectric material is described in operation 206 of method 200. In some embodiments, the layer of sacrificial dielectric material is a high-k dielectric material such as hafnium oxide (HfO). A dielectric fill material 322 is deposited over the sacrificial dielectric layer 320 to fill the volume between the sides of the semiconductor cap layer 318 covered by sacrificial dielectric material 320. In some embodiments, the dielectric fill material is a low-k dielectric material such as Black Diamond®, SiCOH, or a porous organo-silicon material. A CMP process has been performed in order to remove portions of the sacrificial dielectric material 320 and the dielectric fill material 322 which are on a top surface of the semiconductor cap layer 318, exposing the top surface of the semiconductor cap layer 318.

FIG. 3D is a diagram of a semiconductor device 300 during a manufacturing process. In FIG. 3D, the dielectric fill 322 has been recessed to about the same height as the top of the topmost layer of second semiconductor material 308B. In some embodiments, recessing the dielectric fill is described in operation 206 of method 200. The opened portion between the layers of sacrificial dielectric material has been filled with a high-k dielectric fill 324. Semiconductor device 300 has been planarized with a CMP process to expose the hardmask layers, and the hardmask layers 312-316 have been removed (by, e.g., sequential liquid etch processes which are selective for the high-k dielectric fill 324) to expose the topmost layer of second semiconductor material 308A, leaving an upper portion of the isolating fin exposed above the top of the of the active area fin.

FIG. 3E is a diagram of a semiconductor device 300 during a manufacturing process. Operations 208 and 210 of method 200 which produce semiconductor device 300 in FIG. 3E, from the semiconductor device 300 of FIG. 3D, in some embodiments, are described above. In FIG. 3E, dummy gate electrodes 334 are deposited over the isolating fins 325 and the transistor active areas (active areas) 309. A dummy gate liner (or, a dummy gate spacer) 326 is deposited between a polysilicon layer 328 and the isolating fin 325. In some embodiments, the dummy gate liner is an oxide or a nitride material which is more susceptible to etch than the gate electrode spacers 336 deposited at the sides of the dummy gate electrodes 334. In some embodiments, the dummy gate electrode includes a polysilicon layer 328. A nitride hardmask 330 and an oxide hardmask 332 are deposited over the polysilicon layer 328 for protection from accidental etching during manufacturing. Dummy gate electrodes are etched down to the top surface of the recessed semiconductor cap layer 318 and the top surface of the topmost second semiconductor material 308A in the active area 325. A gate electrode spacer 336 is deposited over the top and sides of the dummy gate electrodes 334, and a second etch process is performed to expose the top surface of the substrate pillar 306 and the isolation structure 304 between substrate pillars 306. Ends of the first semiconductor material 308A, the semiconductor cap layer 318, and the second semiconductor material 308B are exposed by the second etch process, wherein the active area fin is trimmed into individual transistor active areas 309.

FIG. 3F is a diagram of a semiconductor device 300 during a manufacturing process. Operations 212 and 214 of method 200 are used to produce representative semiconductor devices such as semiconductor device 300 in FIG. 3F, from a representative device such as in FIG. 3D, in some embodiments. In FIG. 3F, the active area spacer 338 has been deposited in a portion of the semiconductor device 300 between the isolating fin 325 and the active areas 309. In source/drain (SD) regions 346 of the isolating fin 325, the sacrificial dielectric material (not shown, but see sacrificial dielectric material 320 in FIG. 3E) has been recessed to expose the sides of dielectric fill material 322 and high-k dielectric fill 324. Some sacrificial dielectric material 320 is present below the bottom of dielectric fill material 320 and above the isolation structure 304. Active area spacer 338 extends from a top surface of the isolating fin 325, along the side of the isolating fin 325 between the high-k dielectric fill 324 and the gate electrode spacer 336, and between the dielectric fill material 322 and the semiconductor cap layer 318, down to the isolation structure 304. In some SD regions 346, the isolating fin 325 is partially recessed. Gate electrode regions 348 are covered by the dummy gate electrodes 334 and the gate electrode spacers 336.

FIG. 3G is a diagram of a semiconductor device 300 during a manufacturing process. Operations 216 and 218 of Method 200 are used to convert semiconductor device, as described in FIG. 3F, into the embodiment described in FIG. 3G, in some embodiments. In FIG. 3G, the dummy gate electrode has been removed, and the SD regions 346 have been filled with dielectric liner 340, a dielectric material 342, and a dielectric hardmask 344. Gate electrode region 348 is exposed and gate electrode spacer 336 is along the high-k dielectric 324 of isolating fin 325 (e.g., an upper portion of the isolating fin). The dielectric liner 340 extends from the top of gate electrode spacer 336, down along the isolating fins 325 and down to the substrate pillars 306 and the isolation structure 304. Semiconductor cap layer 318 has been completely removed and the channel portions of the second semiconductor material 308B are exposed in the gate electrode region 348. In some embodiments, some of the semiconductor cap layer 318 is left behind, and is oxidized during formation of the gate dielectric layer (not shown). Sacrificial dielectric material 320 is exposed in the opening formed after removal of the semiconductor cap layer 318, from the top to the bottom of the isolating fins 325.

FIG. 3H is a diagram of a semiconductor device 300 during a manufacturing process. Operations 220 and 222 of method 200 are used to convert semiconductor device 300 as represented in FIG. 3G into the embodiment represented in FIG. 3H. In FIG. 3H, the sacrificial dielectric material 320 has been trimmed to produce a larger separation distance between the isolating fin 325 and the channel portions of the second semiconductor material 308B in the gate electrode region 348.

Aspects of the present disclosure relate to a semiconductor device which includes an active area extending in a first direction over a substrate, the active area comprising a conductive path extending from a source region, through a channel region, to a drain region; a gate dielectric on a surface of the channel region; an isolating fin at a first side of the active area, wherein the isolating fin includes a first fin region having a first fin width adjacent to the source region, a second fin region having a second fin width adjacent to the channel region, and a third fin region having the first fin width adjacent to the drain region, wherein the first fin width is larger than the second fin width; and a gate electrode against the gate dielectric in the channel region. In some embodiments, the semiconductor device further includes a first gate electrode spacer on a source side of the gate electrode; and a second gate electrode spacer on a drain side of the gate electrode. In some embodiments, the semiconductor device further includes a first active area spacer between the first gate electrode spacer and the isolating fin; and a second active area spacer between the second gate electrode spacer and the isolating fin. In some embodiments of the semiconductor device, the first gate electrode spacer and the second gate electrode spacer comprise a first spacer material, and the first active area spacer and the second active area spacer comprise a second spacer material different from the first spacer material. In some embodiments of the semiconductor device, the first active area spacer and the second active area spacer extend along the isolating fin from a top end of the isolating fin down to the substrate. In some embodiments of the semiconductor device, the isolating fin includes a first dielectric fill material in a first portion of the isolating fin closer to the substrate; a second dielectric fill material in a second portion of the isolating fin, wherein the first portion of the isolating is closer to the substrate than the second portion of the isolating fin; a sacrificial dielectric layer between the active area and the first dielectric fill material and the second dielectric fill material. In some embodiments of the semiconductor device, the sacrificial dielectric layer extends along a first side of the isolating fin from a top end of the isolating fin down to a bottom end of the isolating fin, between the first dielectric fill material and the lower end of the isolating fin, and along a second side of the isolating fin opposite from the first side of the isolating fin, up to the top end of the isolating fin. In some embodiments of the semiconductor device, the first dielectric fill material is a low-k dielectric material. In some embodiments of the semiconductor device, the second dielectric fill material and the sacrificial dielectric layer are a same dielectric material. In some embodiments of the semiconductor device, the sacrificial dielectric layer is a high-k dielectric material.

Aspects of the present disclosure relate to a method of making a semiconductor device, including operations directed toward manufacturing an active area fin extending in a first direction over a substrate, wherein the active area fin comprises a source region, a drain region, and a channel region between the source region and the drain region; manufacturing an isolation structure next to the active area fin; manufacturing isolating fins next to the active area fin and over the isolation structure; trimming the isolating fins in first fin regions adjacent to the channel regions of the active area fin; and depositing a gate electrode material against the first fin region and the gate dielectric in the channel region. Some embodiments of the method include operations directed toward manufacturing dummy gate electrodes over the active area fin and the isolating fins, wherein the dummy gate electrodes extend in a second direction different from the first direction; manufacturing a first spacer on each side of the dummy gate electrodes, the first spacer extending in the second direction; trimming the isolating fins in second fin regions adjacent to the source regions; trimming the isolating fins in third fin regions adjacent to the drain regions; and manufacturing an active area spacer against the isolating fins and against the source regions and the drain regions of the active area fin. Some embodiments of the method include operations directed toward manufacturing isolating fins next to the active area fin which include steps for depositing a sacrificial dielectric material along sides of the active area fin, depositing a first dielectric fill material over the sacrificial dielectric material, depositing a second dielectric fill material over the first dielectric fill material, and wherein trimming the isolating fins further comprises etching the sacrificial dielectric material. Some of the method include steps for trimming the isolating fins in the second fin regions and trimming the isolating fins in the third fin regions further comprises etching the isolating fins away from the gate electrode spacer, where manufacturing an active area spacer against the isolating fins further includes depositing the active area spacer between the first spacer and the isolating fins. In some embodiments, manufacturing an active area fin further includes depositing alternating layers of a first semiconductor material and a second semiconductor material over the substrate; etching the alternating layers into trimmed pillar portions; recessing the isolation structure to below the alternating layers of the first semiconductor material and the second semiconductor material; and depositing a cap layer of the first semiconductor material over sides and a top surface of the trimmed pillar portions. Some embodiments of the method include operations directed toward depositing hardmask materials over the alternating layers of the first semiconductor material and the second semiconductor material; and manufacturing hardmask pillar caps by etching the hardmask materials. Some embodiments of the method include operations directed toward depositing a layer of sacrificial dielectric material against sides of the hardmask pillar caps and sides of the trimmed pillar portions; and depositing a first dielectric fill material over the sacrificial dielectric material. Some embodiments of the method include steps directed toward recessing the first dielectric fill material; and depositing a second dielectric fill material over the first dielectric fill material and over the sacrificial dielectric material.

Aspects of the present disclosure relate to a semiconductor device, which includes a transistor active area having a source portion, a drain portion, and a channel portion between the source portion and the drain portion; a gate dielectric on the channel portion of the transistor active area; an isolating fin next to the transistor active area, wherein the isolating fin extends in a first direction along the transistor active area, and wherein the source portion and the drain portion are a first separation distance from the isolating fin, the first separation distance being measured in a second direction perpendicular to the first direction; and a gate electrode against the gate dielectric on the channel portion and against the isolating fin, wherein the gate dielectric has a gate electrode width measured in the second direction between the isolating fin and the gate dielectric, the gate electrode width being larger than the first separation distance. In some embodiments, the semiconductor device includes an active area spacer extending along the isolating fin between the gate electrode and the source portion, and along the isolating fin between the gate electrode and the drain portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an active area extending in a first direction over a substrate, the active area comprising a conductive path extending from a source region, through a channel region, to a drain region;
   a gate dielectric on a surface of the channel region;
   an isolating fin at a first side of the active area, wherein the isolating fin comprises
      a first fin region having a first fin width adjacent to the source region,
      a second fin region having a second fin width adjacent to the channel region, and
      a third fin region having the first fin width adjacent to the drain region, wherein the first fin width is larger than the second fin width, and width is measured in a second direction perpendicular to the first direction; and
   a gate electrode against the gate dielectric in the channel region.

2. The semiconductor device of claim 1, further comprising:
   a first gate electrode spacer on a source side of the gate electrode; and
   a second gate electrode spacer on a drain side of the gate electrode.

3. The semiconductor device of claim 2, further comprising:
   a first active area spacer between the first gate electrode spacer and the isolating fin; and
   a second active area spacer between the second gate electrode spacer and the isolating fin.

4. The semiconductor device of claim 3, wherein
   the first gate electrode spacer and the second gate electrode spacer comprise a first spacer material, and
   the first active area spacer and the second active area spacer comprise a second spacer material different from the first spacer material.

5. The semiconductor device of claim 3, wherein the first active area spacer and the second active area spacer extend along the isolating fin from a top end of the isolating fin down to the substrate.

6. The semiconductor device of claim 1, wherein the isolating fin further comprises:
   a first dielectric fill material in a first portion of the isolating fin closer to the substrate;
   a second dielectric fill material in a second portion of the isolating fin, wherein the first portion of the isolating fin is closer to the substrate than the second portion of the isolating fin;
   a sacrificial dielectric layer between the active area and the first dielectric fill material and the second dielectric fill material.

7. The semiconductor device of claim 6, wherein the sacrificial dielectric layer extends
   along a first side of the isolating fin from a top end of the isolating fin down to a bottom end of the isolating fin, between the first dielectric fill material and the lower end of the isolating fin, and
   along a second side of the isolating fin opposite from the first side of the isolating fin, up to the top end of the isolating fin.

8. The semiconductor device of claim 6, wherein the first dielectric fill material is a low-k dielectric material.

9. The semiconductor device of claim 6, wherein the second dielectric fill material and the sacrificial dielectric layer are a same dielectric material.

10. The semiconductor device of claim 6, wherein the sacrificial dielectric layer is a high-k dielectric material.

11. A semiconductor device, comprising:
    a transistor active area comprising a source portion, a drain portion, and a channel portion between the source portion and the drain portion;
    a gate dielectric on the channel portion of the transistor active area;
    an isolating fin next to the transistor active area, wherein the isolating fin extends in a first direction along the transistor active area, and wherein the source portion and the drain portion are a first separation distance from the isolating fin, the first separation distance being measured in a second direction perpendicular to the first direction; and
    a gate electrode against the gate dielectric on the channel portion and against the isolating fin, wherein the gate dielectric has a gate electrode width measured in the second direction between the isolating fin and the gate dielectric, the gate electrode width being larger than the first separation distance.

12. The semiconductor device of claim 11, further comprising:
    an active area spacer extending along the isolating fin between the gate electrode and the source portion, and along the isolating fin between the gate electrode and the drain portion.

13. A semiconductor device, comprising:
    an active area comprising:
       a source region,
       a drain region, and
       a channel region between the source region and the drain region in a first direction;
    an isolating fin, wherein the isolating fin comprises:
       a first fin region extending parallel to the active area and having a first fin width adjacent to the source region, and
       a second fin region extending parallel to the active area and having a second fin width adjacent to the channel region, wherein width is measured in a second direction perpendicular to the first direction, and the second fin width is different from the first fin width.

14. The semiconductor device of claim 13, wherein the first fin region extends beyond the second fin region in the first direction on both sides of the first fin region.

15. The semiconductor device of claim 13, wherein the first fin width ranges from 12 nanometers (nm) to 30 nm.

16. The semiconductor device of claim 13, wherein the second fin width ranges from 6 nm to 20 nm.

17. The semiconductor device of claim 13, wherein a first distance from the source region to the first fin region is less than a second distance from the channel region to the second fin region.

18. The semiconductor device of claim 13, wherein the isolating fin further comprises a third fin region having a third fin width adjacent to the drain region, and the third fin width is different from the second fin width.

19. The semiconductor device of claim 18, wherein the first fin width is equal to the third fin width.

20. The semiconductor device of claim 13, further comprising a second active region, wherein the isolation fin is between the active region and the second active region in the second direction.

* * * * *